(12) United States Patent
Wang et al.

(10) Patent No.: US 12,063,769 B2
(45) Date of Patent: Aug. 13, 2024

(54) METHOD FOR MANUFACTURING A SEMICONDUCTOR STRUCTURE USING ISOLATION LAYERS FOR ETCHING THE TRENCHES IN A SUBSTRATE

(71) Applicant: CHANGXIN MEMORY TECHNOLOGIES, INC., Hefei (CN)

(72) Inventors: Jinghao Wang, Hefei (CN); Xin Xin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 418 days.

(21) Appl. No.: 17/602,960

(22) PCT Filed: Jul. 15, 2021

(86) PCT No.: PCT/CN2021/106516
§ 371 (c)(1),
(2) Date: Oct. 11, 2021

(87) PCT Pub. No.: WO2022/183660
PCT Pub. Date: Sep. 9, 2022

(65) Prior Publication Data
US 2023/0055202 A1   Feb. 23, 2023

(30) Foreign Application Priority Data

Mar. 4, 2021   (CN) .......................... 202110240323.8

(51) Int. Cl.
*H10B 12/00* (2023.01)
*H01L 23/528* (2006.01)

(52) U.S. Cl.
CPC ..... *H10B 12/0387* (2023.02); *H01L 23/5283* (2013.01); *H10B 12/37* (2023.02); *H10B 12/482* (2023.02); *H10B 12/485* (2023.02)

(58) Field of Classification Search
CPC .. H10B 12/0387; H10B 12/37; H10B 12/482; H10B 12/485
(Continued)

(56) References Cited

U.S. PATENT DOCUMENTS

| 9,419,002 B2 | 8/2016 | Han et al. |
| 9,947,669 B1 | 4/2018 | Takesako et al. |

(Continued)

FOREIGN PATENT DOCUMENTS

| CN | 108878442 A | 11/2018 |
| CN | 109979940 A | 7/2019 |

(Continued)

OTHER PUBLICATIONS

International Search report cited in PCT/CN2021/106516, mailed Dec. 8, 2021, 9 pages.

*Primary Examiner* — Hoai V Pham
(74) *Attorney, Agent, or Firm* — Kilpatrick Townsend & Stockton LLP

(57) ABSTRACT

Embodiments of the present disclosure provide a semiconductor structure and a method for manufacturing the same. The manufacturing method includes: providing a substrate and bit line structures on the substrate; forming a first isolation layer, the first isolation layer being located on side walls of the bit line structures and on the substrate; forming a second isolation layer, the second isolation layer covering the first isolation layer located on the side walls of the bit line structures, and exposing the first isolation layer located on the substrate; removing the first isolation layer exposed by the second isolation layer and part of the first isolation layer below the second isolation layer, so that remaining of the first isolation layer is recessed compared to the second isolation layer toward the side walls of the bit line structures to form a groove.

10 Claims, 7 Drawing Sheets

(58) Field of Classification Search
USPC .......................................................... 438/262
See application file for complete search history.

(56) References Cited

U.S. PATENT DOCUMENTS

2015/0028492 A1    1/2015  Jung et al.
2022/0149048 A1*   5/2022  Rhee ................... H10B 12/315

FOREIGN PATENT DOCUMENTS

CN      110970351 A    4/2020
CN      111223860 A    6/2020
CN      113035871 A    6/2021

* cited by examiner

METHOD FOR MANUFACTURING A SEMICONDUCTOR STRUCTURE USING ISOLATION LAYERS FOR ETCHING THE TRENCHES IN A SUBSTRATE

CROSS-REFERENCE TO RELATED APPLICATIONS

The present disclosure is a national stage entry of International Application No. PCT/CN2021/106516, filed on Jul. 15, 2021, which claims the priority to Chinese Patent Application 202110240323.8, titled "SEMICONDUCTOR STRUCTURE AND METHOD FOR MANUFACTURING SAME", filed on Mar. 4, 2021. The entire contents of International Application No. PCT/CN2021/106516 and Chinese Patent Application 202110240323.8 are incorporated herein by reference.

TECHNICAL FIELD

The present disclosure relates to, but is not limited to, a semiconductor structure and a method for manufacturing the same.

BACKGROUND

Dynamic Random Access Memory (DRAM) in a semiconductor structure is a semiconductor memory widely used in computer systems. The main principle of DRAM is to use the number of charges stored in a capacitor to represent whether a binary bit is 1 or 0.

However, in order to improve the integration level of semiconductor integrated circuits, the critical dimension of DRAM is increasingly small. Therefore, the process for manufacturing DRAM is increasingly difficult, and its performance also needs to be further improved.

SUMMARY

The subject matter is described in detail herein below, which is not intended to limit the scope of protection of claims.

An embodiment of the present disclosure provides a method for manufacturing a semiconductor structure, including: providing a substrate and bit line structures on the substrate; forming a first isolation layer, the first isolation layer being located on side walls of the bit line structures and on the substrate; forming a second isolation layer, the second isolation layer covering the first isolation layer located on the side walls of the bit line structures, and exposing the first isolation layer located on the substrate; removing the first isolation layer exposed by the second isolation layer and part of the first isolation layer below the second isolation layer, so that remaining of the first isolation layer is recessed compared to the second isolation layer toward the side walls of the bit line structures to form grooves; forming a third isolation layer filling the grooves, the third isolation layer covering a surface of the first isolation layer exposed by the grooves, and a material of the third isolation layer being different from a material of the first isolation layer; etching the substrate between adjacent parts of the second isolation layers to form trenches, the trenches being located between adjacent bit line structures; and forming a capacitor contact layer, the capacitor contact layer filling the trenches and being located between the adjacent bit line structures.

An embodiment of the present disclosure provides a semiconductor structure, including: a substrate and bit line structures on the substrate; a first isolation layer, the first isolation layer being located on side walls of the bit line structures and on the substrate; a second isolation layer, the second isolation layer covering the first isolation layer located on the side walls of the bit line structures, and the second isolation layer also being located on the substrate, wherein compared to the second isolation layer on the substrate, the first isolation layer on the substrate is recessed toward the side walls of the bit line structures, and grooves are formed at the recession; a third isolation layer located in the grooves, the third isolation layer covering a surface of the first isolation layer exposed by the grooves, and a material of the first isolation layer being different from a material of the third isolation layer, wherein trenches are formed in the substrate between adjacent parts of the second isolation layers, and the trenches are located between adjacent bit line structures; and a capacitor contact layer located in the trenches, the capacitor contact layer fills the trenches and is located between the adjacent bit line structures.

After the drawings and detailed description are read and understood, other aspects may be understood.

BRIEF DESCRIPTION OF THE DRAWINGS

The drawings, which are incorporated in and constitute a part of the specification, illustrate embodiments of the present application and together with the description serve to explain the principles of the embodiments of the present disclosure. In these drawings, similar reference numerals are configured to represent similar elements. The drawings in the following description are only some rather than all of the embodiments of the present disclosure. Those skilled in the art would be able to derive other drawings from these drawings without any creative efforts.

One or more embodiments are exemplified by corresponding drawings. These exemplified descriptions do not constitute limitations on the embodiments. The elements with the same reference numerals in the drawings are denoted as similar elements. Unless otherwise stated, the drawings do not constitute proportional limitations.

DETAILED DESCRIPTION

Figure 1:
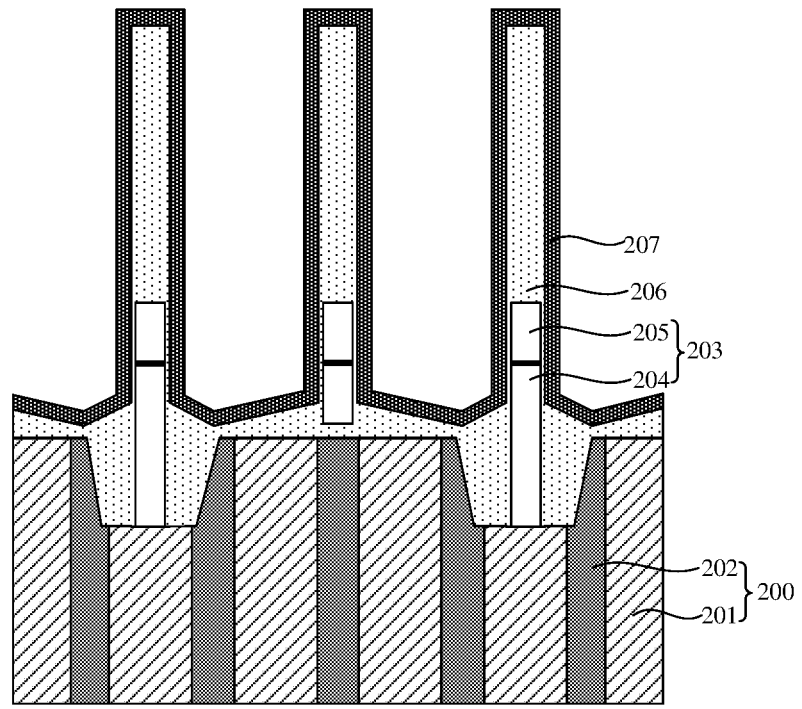
FIG. 1 is a schematic diagram of a semiconductor structure corresponding to a step of forming a first isolation layer in a method for manufacturing a semiconductor structure.

It can be seen from the background art that the performance of DRAM needs to be further improved.

Refer to FIGS. 1 to 8, which are structural schematic diagrams corresponding to various steps in a method for manufacturing a semiconductor structure. The semiconductor structure in the above figures is a DRAM. The DRAM usually includes a substrate 200, bit line structures 203, an insulating cap layer 206, a first isolation layer 207, a capacitor contact layer 210, etc. The substrate 200 includes isolation structures 202 and active areas 201; each of the bit line structure 203 includes a bit line contact layer 204 and a bit line conductive layer 205; the insulating cap layer 206 is located on the bit line conductive layer 205, and is also located on side walls of the bit line contact layer 204 and the bit line conductive layer 205, and the insulating cap layer 206 also covers the surface of the substrate 200; the first isolation layer 207 is located on side walls of the bit line structures 203, and the first isolation layer 207 can prevent current leakage or a short circuit between the bit line structure 203 and the capacitor contact layer 210.

Figure 2:
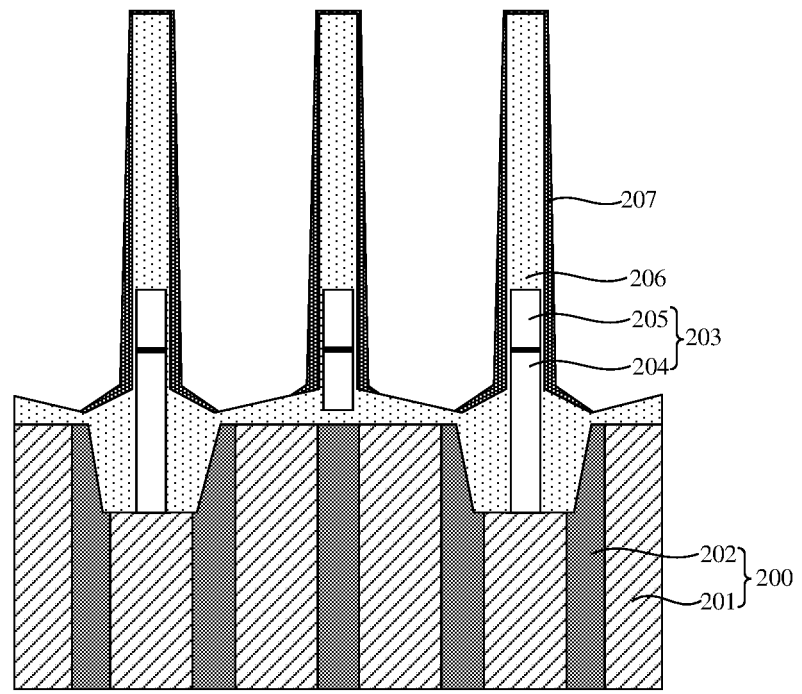
FIG. 2 is a schematic diagram of a semiconductor structure corresponding to a step of removing part of the first isolation layer on a substrate and reducing the thickness of the remaining of the first isolation layer in the method of manufacturing a semiconductor structure.
Figure 3:
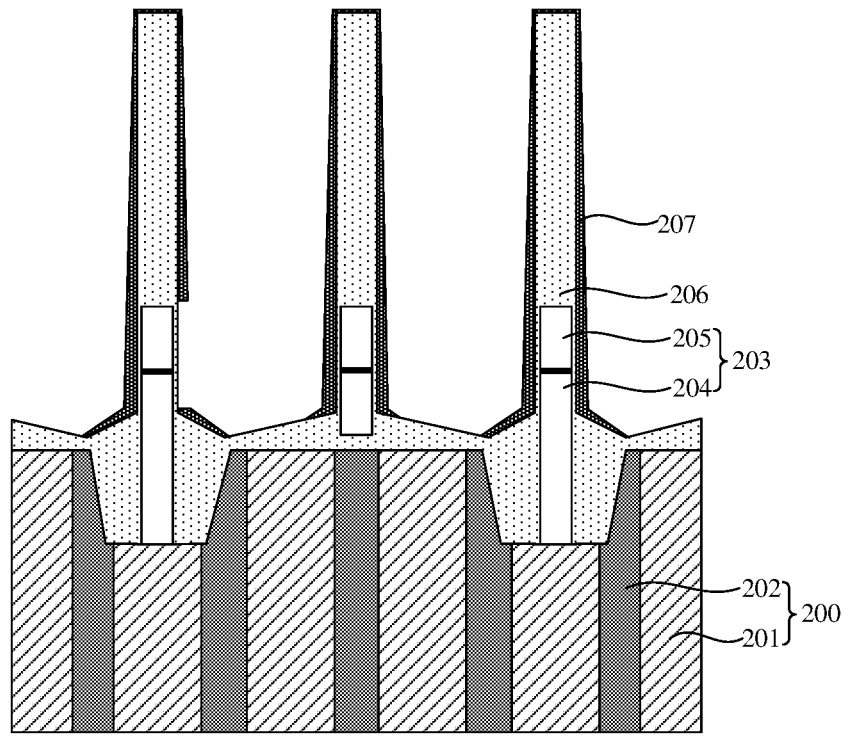
FIG. 3 is a schematic diagram of a semiconductor structure corresponding to a step of cleaning the semiconductor structure with a dilute sulfuric peroxide in the method for manufacturing a semiconductor structure.
Figure 4:
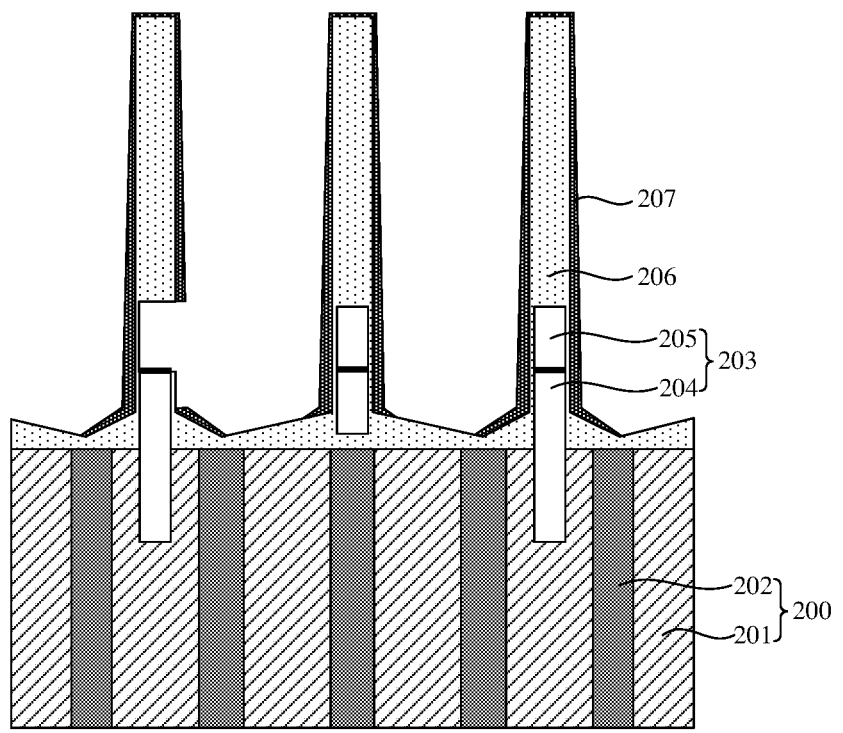
FIG. 4 is a schematic diagram of a semiconductor structure corresponding to a step of cleaning the semiconductor structure with a sulfuric peroxide mixture in the method for manufacturing a semiconductor structure.
Figure 5:
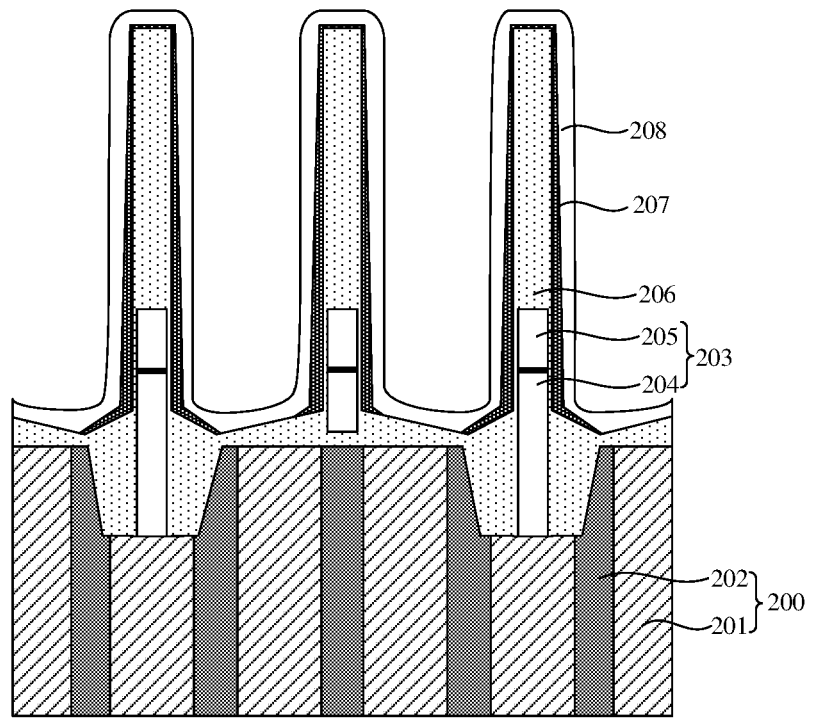
FIG. 5 is a schematic diagram of a semiconductor structure corresponding to a step of forming a second isolation layer in the method for manufacturing a semiconductor structure.
Figure 6:
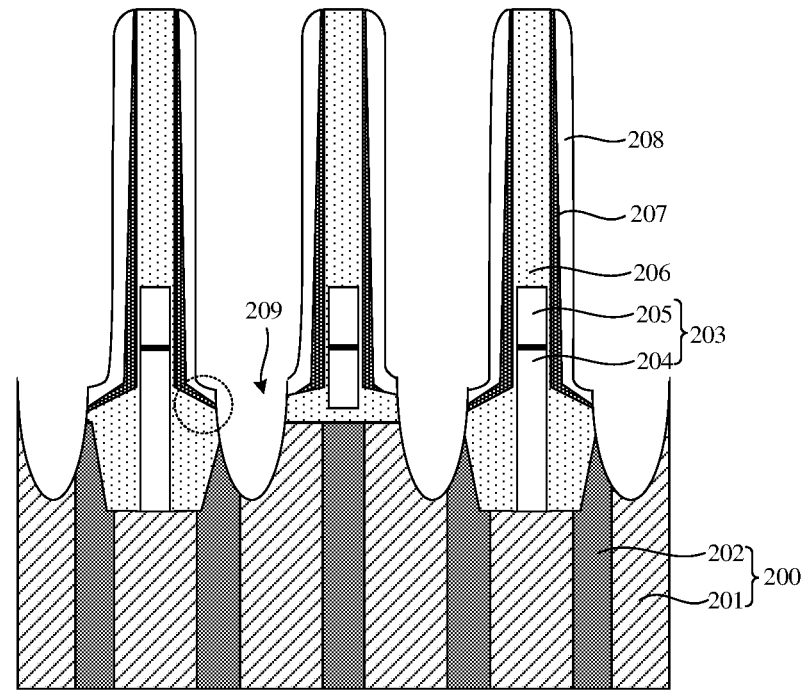
FIG. 6 is a schematic diagram of a semiconductor structure corresponding to a step of forming trenches in the method for manufacturing a semiconductor structure.
Figure 7:
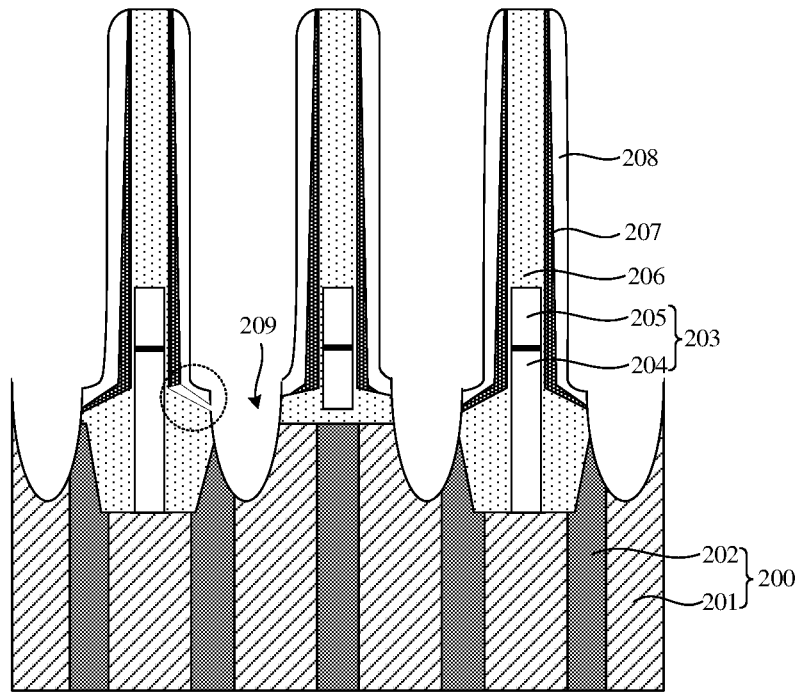
FIG. 7 is a schematic diagram of a semiconductor structure corresponding to a step of cleaning the semiconductor structure in the method for manufacturing a semiconductor structure.
Figure 8:
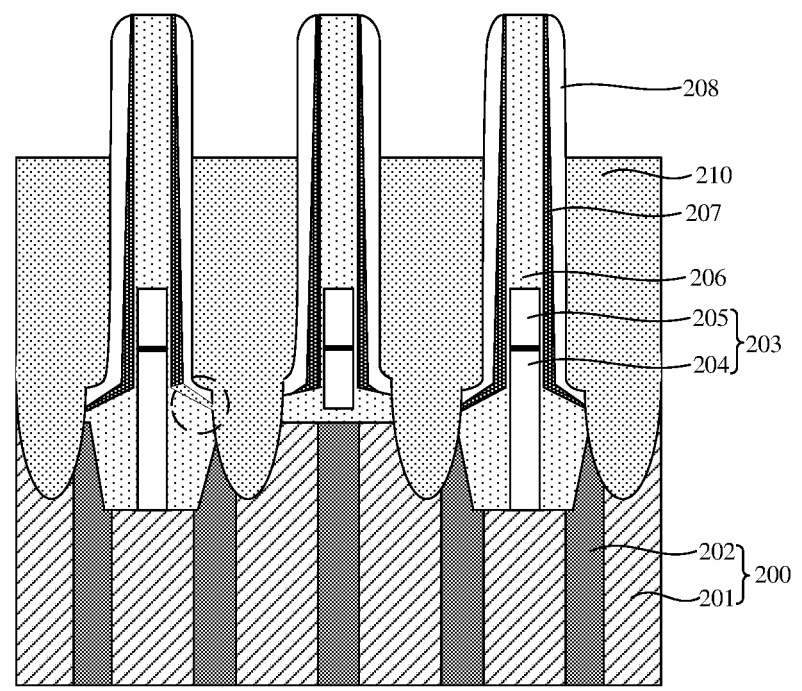
FIG. 8 is a schematic diagram of a semiconductor structure corresponding to a step of forming a capacitor contact layer in the method for manufacturing a semiconductor structure.

Referring to FIG. 1, the first isolation layer 207 is formed on the side walls of the bit line structures 203 and the substrate 200, and the first isolation layer 207 also covers the insulating cap layer 206; referring to FIG. 2, part of the first isolation layer 207 on the substrate 200 is removed by dry etching, and the thickness of the remaining of the first isolation layer 207 is reduced. It is understandable that, in order to reduce the size of the DRAM, the first isolation layer 207 should have a relatively small thickness. Referring to FIGS. 3 and 4, the semiconductor structure is cleaned to remove impurities left by the etching. Referring to FIG. 3, if the semiconductor structure is cleaned with a dilute sulfuric peroxide (DSP), the first isolation layer 207 which is relatively thin is easily damaged, resulting in a risk of current leakage. Referring to FIG. 4, if the semiconductor structure is cleaned with a sulfuric peroxide mixture (SPM), the bit line conductive layer 205 is also easily damaged, resulting in failure of the bit line conductive layer 205, which then affects the yield of the semiconductor structure; referring to FIG. 5, the second isolation layer 208 is formed on the surface of the first isolation layer 207 and the surface of the substrate 200; referring to FIG. 6, the substrate 200 between adjacent bit line structures 203 is etched to form trenches 209. During the etching, the trenches 209 easily exposes the first isolation layer 207. Referring to FIG. 7, the semiconductor structure is cleaned to remove impurities generated by the etching. Because the first isolation layer 207 is exposed, the exposed first isolation layer 207 is easily removed during the cleaning, resulting in voids (circled by dotted lines); referring to FIG. 8, the capacitor contact layer 210 is formed between the adjacent bit line structures 203. The material of the capacitor contact layer 210 easily enters the voids, resulting in current leakage or a short circuit between the bit line structure 203 and the capacitor contact layer 210.

An embodiment of the present disclosure provides a method for manufacturing a semiconductor structure. The manufacturing method includes: forming a first isolation layer, the first isolation layer being located on side walls of a bit line structure and a substrate; and forming a second isolation layer, the second isolation layer covering the first isolation layer on the side walls of the bit line structure, and exposing the first isolation layer on the substrate. The second isolation layer is formed directly after the first isolation layer is formed, and part of the first isolation layer on the substrate is not removed by etching, so the semiconductor structure does not need to be cleaned before the second isolation layer is formed to remove impurities produced by the etching, and correspondingly, the side walls of the first isolation layer and the bit line structure will not be damaged during the cleaning. The manufacturing method further includes: removing the first isolation layer exposed by the second isolation layer and part of the first isolation layer below the second isolation layer, so that remaining of the first isolation layer is recessed compared to the second isolation layer toward the side walls of the bit line structure to form grooves; forming a third isolation layer filling the grooves, the third isolation layer covering the surface of the first isolation layer exposed by the grooves; etching the substrate between adjacent parts of the second isolation layers to form trenches; and forming a capacitor contact layer filling the trenches. Because the third isolation layer covers the first isolation layer exposed by the grooves, the third isolation layer can protect the first isolation layer from being exposed during the process of forming the trenches by etching, which avoids damage to the first isolation layer and voids, and then avoids current leakage or a short circuit between the material of the capacitor contact layer and the bit line structure through the voids.

The embodiments of the present disclosure will be described in detail below with reference to the accompanying drawings. However, those skilled in the art can understand that, in each embodiment of the present disclosure, many technical details are proposed in order to enable a reader to better understand the present application. However, the technical solutions of the present application can also be implemented without these technical details and various variations and modifications based on the following embodiments.

An embodiment of the present disclosure provides a method for manufacturing a semiconductor structure. FIGS. 9-14 are structural schematic diagrams corresponding to various steps of the method for manufacturing a semiconductor structure provided in this embodiment. A detailed description will be given below in conjunction with the drawings.

Figure 9:
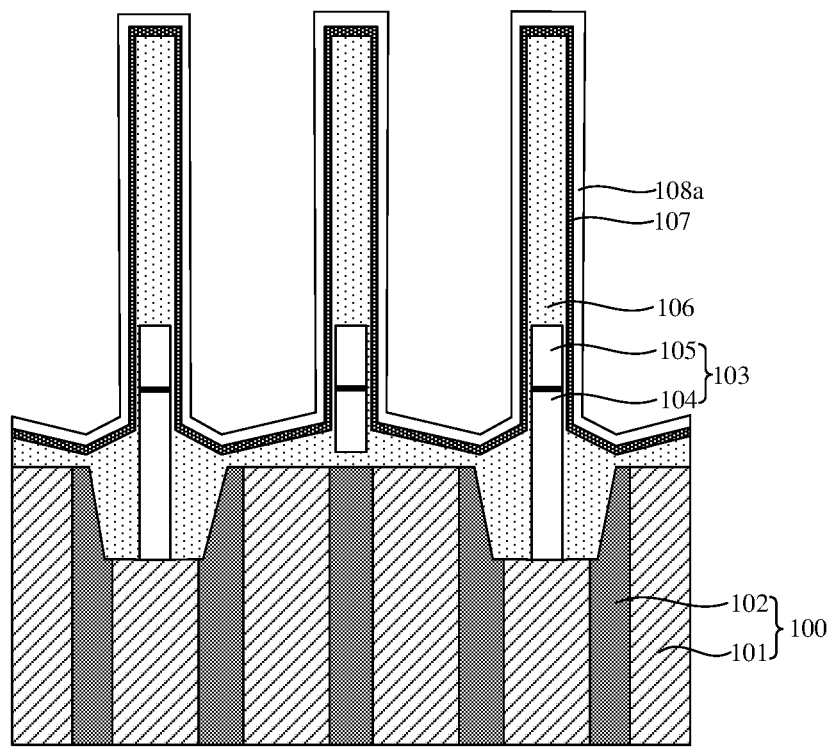
FIG. 9 is a schematic diagram of a semiconductor structure corresponding to a step of providing a substrate and a bit line structure on the substrate according to an embodiment of the present disclosure.

Referring to FIG. 9, a substrate 100 and a bit line structure 103 on the substrate 100 are provided.

The substrate 100 includes a plurality of discrete active areas 101, and each active area 101 has a source and a drain. The bit line structure 103 is electrically connected to the source/drain. The material of the active area 101 may be monocrystalline silicon, which contains doped ions such as boron or phosphorus.

The substrate 100 further includes an isolation structure 102 for isolating adjacent active areas 101. The material of the isolation structure 102 is an insulating material, such as silicon dioxide, silicon carbide, or silicon nitride.

The bit line structure 103 includes: a bit line contact layer 104 and a bit line conductive layer 105 that are stacked. In this embodiment, the bit line structure 103 further includes a barrier layer between the bit line contact layer 104 and the bit line conductive layer 105.

The bit line contact layer 104 is configured to electrically connect the bit line conductive layer 105 and the active area 101, and its material may be polysilicon. The bit line conductive layer 105 has relatively low resistance, and its material may be tungsten or molybdenum. The barrier layer is configured to block mutual diffusion of the bit line conductive layer 105 and the bit line contact layer 104, and is also configured to increase adhesion between the bit line conductive layer 105 and the bit line contact layer 104, and its material may be titanium nitride or tantalum nitride.

An insulating cap layer 106 is further formed on the bit line conductive layer 105, and the insulating cap layer 106 is also located on side walls of the bit line contact layer 104 and the bit line conductive layer 105 and the surface of the substrate 100. The insulating cap layer 106 is configured to prevent oxidation of the bit line conductive layer 105, and its material is an insulating material, such as silicon nitride.

Continuing to refer to FIG. 9, a first isolation layer 107 is formed, the first isolation layer 107 being located on side walls of the bit line structure 103 and the substrate 100. In this embodiment, the first isolation layer 107 also covers the surface of the insulating cap layer 106.

The first isolation layer 107 has a relatively low dielectric constant, which can reduce parasitic capacitance between the adjacent bit line structures 103, thereby increasing the operating speed of the semiconductor structure. In this embodiment, the material of the first isolation layer 107 is silicon oxide. In other embodiments, the material of the first isolation layer may be silicon oxycarbide.

In this embodiment, the first isolation layer 107 is formed by atomic layer deposition process. The atomic layer deposition process can improve the uniformity and density of the film formed. In other embodiments, the first isolation layer may also be formed by chemical vapor deposition.

Since a second isolation layer will be directly formed on the first isolation layer 107 later, that is, the first isolation layer 107 will not be etched to reduce its thickness, when the first isolation layer 107 is formed by deposition, the thickness of the first isolation layer 107 should be appropriately reduced to prevent the first isolation layer 107 from occupying a relatively large space.

Figure 10:
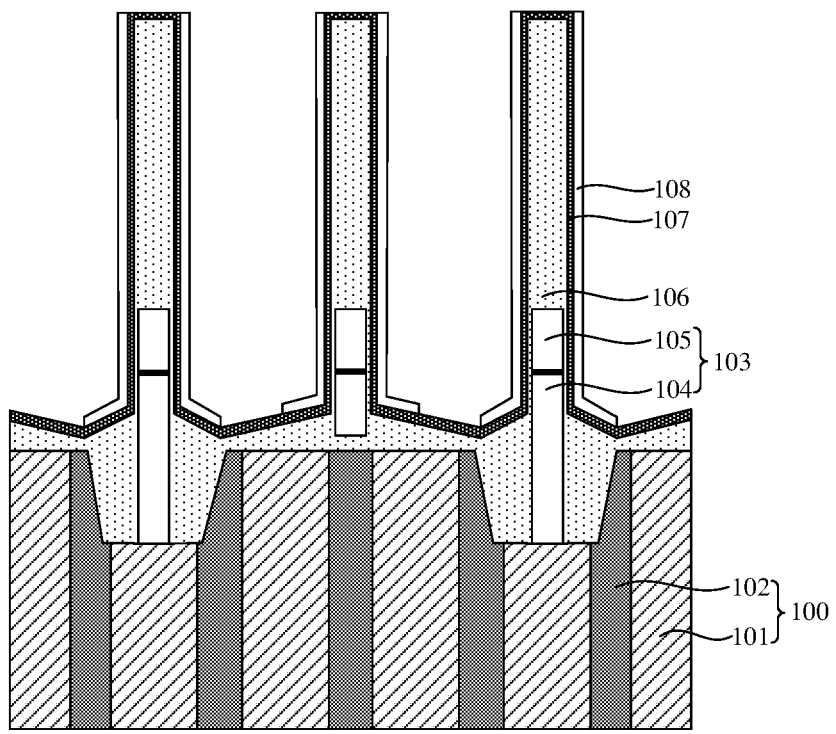
FIG. 10 is a schematic diagram of a semiconductor structure corresponding to a step of removing part of the initial second isolation layer on the substrate according to an embodiment of the present disclosure.

Referring to FIGS. 9 and 10, a second isolation layer 108 is formed, the second isolation layer 108 covering the first isolation layer 107 on the side walls of the bit line structure 103, and exposing the first isolation layer 107 on the substrate 100.

The second isolation layer 108 has greater hardness and density, which can improve the isolation effect, to avoid electrical connection between the bit line structure 103 and a capacitor contact layer formed later, so as to avoid problems such as a short circuit or current leakage. In addition, the second isolation layer 108 has better corrosion resistance, which can avoid damage during the cleaning. In this embodiment, the material of the second isolation layer 108 is silicon nitride. In other embodiments, the material of the second isolation layer may be silicon oxynitride.

In this embodiment, after the first isolation layer 107 is formed, the second isolation layer 108 is directly formed on the first isolation layer 107, and the first isolation layer 107 is not etched before the second isolation layer 108 is formed. Therefore, the semiconductor structure does not need to be cleaned to remove impurities produced by the etching, which can avoid damage to the side walls of the first isolation layer 107 and the bit line conductive layer 105 by a cleaning agent, thereby improving the yield of the semiconductor structure. In addition, when the semiconductor structure is cleaned later, since the second isolation layer 108 covers part of the first isolation layer 107, the second isolation layer 108 can protect the first isolation layer 107.

In a direction perpendicular to the surface of the substrate 100, the thickness ratio of the first isolation layer 107 to the second isolation layer 108 on the substrate 100 is 0.3 to 4. The first isolation layer 107 has a thickness of 3 to 8 nm, for example, 5 nm, 6 nm, or 7 nm; and the second isolation layer 108 has a thickness of 2 to 10 nm, for example, 3 nm, 6 nm, or 8 nm. When the thickness ratio of the first isolation layer 107 to the second isolation layer 108 is within the above range, the difficulty in forming grooves later can be reduced, and the grooves formed later can also have better firmness, thereby avoiding collapse of the second isolation layer 108 at the grooves.

The step of forming the second isolation layer 108 will be described in detail below.

Referring to FIG. 9, an initial second isolation layer 108a is formed, the initial second isolation layer 108a covering the surface of the first isolation layer 107.

In this embodiment, the initial second isolation layer 108a is formed by atomic layer deposition process. The atomic layer deposition process can improve the uniformity and density of the film formed. In other embodiments, the initial second isolation layer may also be formed by chemical vapor deposition.

Referring to FIG. 10, part of the initial second isolation layer 108a (refer to FIG. 9) on the substrate 100 is removed to expose the first isolation layer 107 on the substrate 100, the remaining of the initial second isolation layer 108a serving as the second isolation layer 108.

In this embodiment, the initial second isolation layer 108a on the top surface of the insulating cap layer 106 is also removed, and the first isolation layer 107 on the top surface of the insulating cap layer 106 is exposed.

In this embodiment, part of the initial second isolation layer 108a is removed by dry etching.

Figure 11:
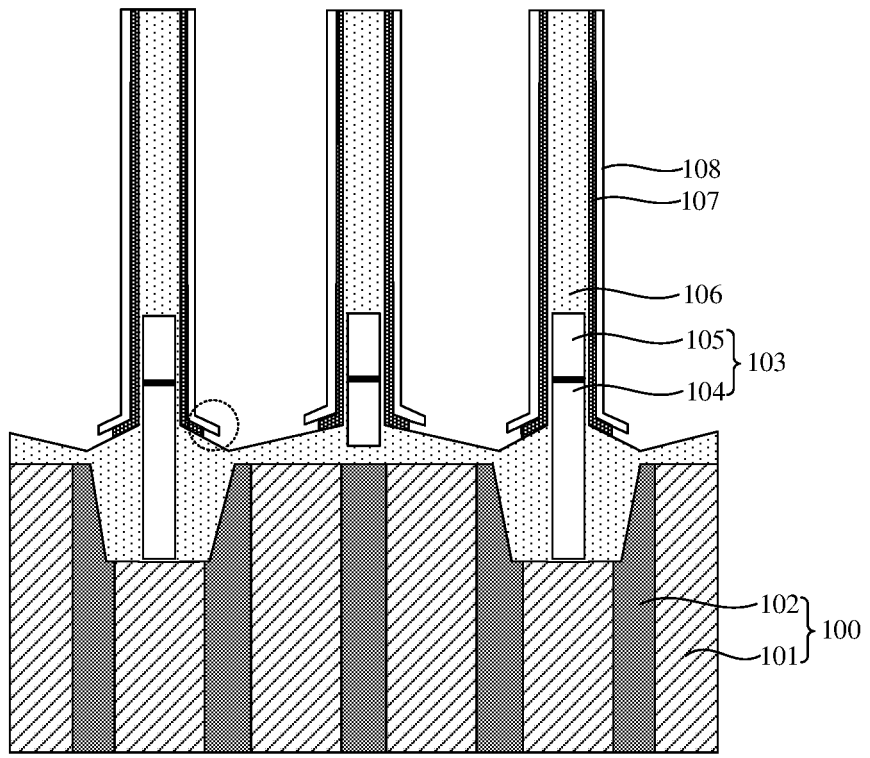
FIG. 11 is a schematic diagram of a semiconductor structure corresponding to a step of removing the first isolation layer exposed by the second isolation layer and part of the first isolation layer below the second isolation layer according to an embodiment of the present disclosure.

Referring to FIG. 11, the first isolation layer 107 exposed by the second isolation layer 108 and part of the first isolation layer 107 below the second isolation layer 108 are removed, so that the remaining of the first isolation layer 107 is recessed compared to the second isolation layer 108 toward the side walls of the bit line structure 103 to form grooves (circled by dotted lines).

Subsequently, a third isolation layer is formed to fill the grooves. The third isolation layer can protect the first isolation layer 107 exposed by the grooves, so as to avoid damage to the first isolation layer 107 by a cleaning agent during the cleaning.

The first isolation layer 107 exposed by the second isolation layer 108 and part of the first isolation layer 107 below the second isolation layer 108 are removed by dry etching. The etching selection ratio of the first isolation layer 107 to the second isolation layer 108 in the dry etching process is 5:1 to 10:1, for example, 7:1, 8:1, or 9:1. When the etching selection ratio of the first isolation layer 107 to the second isolation layer 108 is relatively large, the second isolation layer 108 is not easily damaged, which can ensure that the finally formed grooves has good firmness and avoid collapse.

Generally, the dry etching process has good anisotropy. In this embodiment, the dry etching of the first isolation layer 107 needs to have etching rates in both the lateral and vertical directions. That is, in this embodiment, it is necessary to appropriately reduce the anisotropy of dry etching and appropriately increase the isotropy of dry etching.

The dry etching includes physical etching and chemical etching. The physical etching indicates that gas is ionized into charged ions by glow discharge, and the ions are accelerated by a bias voltage and sputtered onto the surface of an etched object. This process is completely physical ability transfer, so it has good directionality, that is, anisotropy. The chemical etching indicates that etching gas is ionized by plasma to form charged ions, molecules and highly reactive atomic groups, which diffuse to the surface of the etched film and react with atoms on the surface of the etched film to generate volatile reaction products, and the reaction products are extracted from the reaction chamber by vacuum equipment. This process completely utilizes chemical reactions, so it has poor directionality, that is, isotropy. The physical etching and the chemical etching are usually combined, and the physical and chemical effects are adjusted according to the specific conditions of the process.

Since a vertical etching rate and a lateral etching rate need to be obtained, the chemical effect in dry etching can be appropriately increased and the physical effect in dry etching can be reduced in this embodiment. In other embodiments, the first isolation layer may also be etched only by chemical etching.

After the grooves are formed, in a direction parallel to the surface of the substrate 100, the distance from the surface of the first isolation layer 107 exposed by the grooves to the side walls of the bit line structure 103 is a first distance, and the distance from the side of the second isolation layer 108 away from the bit line structure 103 to the side walls of the bit line structure 103 is a second distance. The difference between the first distance and the second distance is the width of the grooves in the direction parallel to the surface of the substrate. The aforementioned ratio of the lateral etching rate to the vertical etching rate can determine the difference between the first distance and the second distance, that is, determine the width of the grooves. If the ratio is larger, the degree of lateral etching is smaller, and the width of the grooves is smaller; if the ratio is smaller, the degree of lateral etching is larger, and the width of the grooves is larger. Therefore, the width of the grooves can be adjusted by adjusting the ratio of the lateral etching rate to the vertical etching rate.

If the grooves are too wide, the third isolation layer formed later will not easily fully fill the grooves; if the grooves are too narrow, the width of the third isolation layer formed later will be smaller. When the difference between the first distance and the second distance is 3 nm to 10 nm, the grooves have a relatively suitable width, which can reduce the filling difficulty and process time of the third isolation layer and enable the third isolation layer to fully protect the first isolation layer.

In this embodiment, in the direction parallel to the surface of the substrate 100, that is, in the lateral direction, the width of the first isolation layer 107 removed by the dry etching is 3 nm to 8 nm, for example, 5 nm, 6 nm, or 7 nm. In addition, during the etching of the first isolation layer 107, the second isolation layer 108 may also be slightly etched, and the width of the second isolation layer 108 removed by the etching is less than 2 nm.

In this embodiment, the process parameters of the dry etching process include: radio frequency power of 300 W to 1500 W, for example, 400 W, 500 W, or 1000 W; etching time of 10 s to 60 s, for example, 20 s, 30 s, or 50 s; and etching temperature of 30° C. to 50° C., for example, 35° C., 40° C., or 45° C. When the radio frequency power is within the above range, the ion beam has sufficient energy and can accelerate the etching rate. In addition, when the etching time is within the above range, relatively suitable grooves width can be obtained, and excessive damage to the semiconductor structure can also be avoided. Moreover, the increase in the etching temperature can increase the activity of the etching gas, thereby increasing the degree of chemical etching. As such, an appropriate lateral etching rate and vertical etching rate can be obtained.

The etching gas used in the dry etching process includes nitrogen trifluoride, hydrogen and nitrogen, which have a relatively large etching selection ratio for the first isolation layer 107 and the second isolation layer 108. The flow ratio of nitrogen trifluoride, hydrogen and nitrogen is (5-10):(200-500):(2000-5000), for example, 7:250:3000, 8:300:3600, or 9:400:4300. When the flow ratio is within the above range, the etching rate can be increased and the process time can be shortened.

Figure 12:
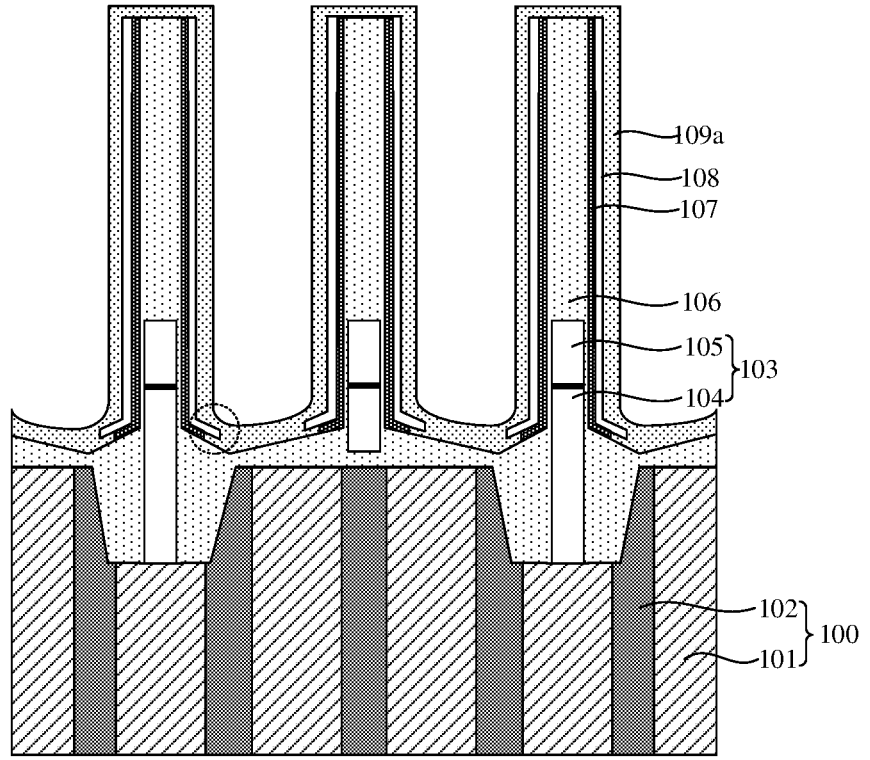
FIG. 12 is a schematic diagram of a semiconductor structure corresponding to a step of forming an initial third isolation layer according to an embodiment of the present disclosure.
Figure 13:
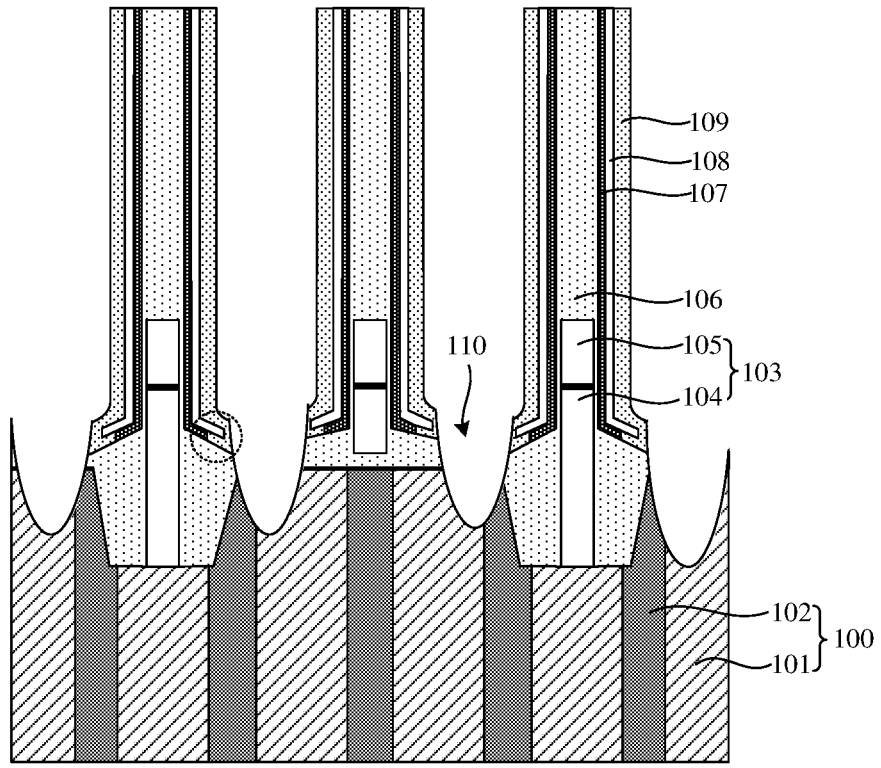
FIG. 13 is a schematic diagram of a semiconductor structure corresponding to a step of forming trenches according to an embodiment of the present disclosure.

Referring to FIGS. 12 and 13, a third isolation layer 109 filling the grooves is formed, the third isolation layer 109 covering the surface of the first isolation layer 107 exposed by the grooves, and the material of the third isolation layer 109 being different from the material of the first isolation layer 107.

The third isolation layer 109 is configured to protect the first isolation layer 107 exposed by the grooves. In the subsequent cleaning process, the first isolation layer 107 will not be damaged by the cleaning agent, and the capacitor contact layer formed later will not undergo short circuiting or current leakage with the bit line structure 103 from the damage position of the first isolation layer 107, thereby improving the yield of the semiconductor structure.

In this embodiment, the formed third isolation layer 109 fills the grooves, and the third isolation layer 109 is also located on side walls of the second isolation layer 108. As such, the third isolation layer 109 can protect the first isolation layer 107 and the bit line structure 103 to a greater extent. In other embodiments, the third isolation layer may only fill the grooves.

The third isolation layer 109 has relatively large hardness and density, and can improve the isolation effect. In addition, the third isolation layer 109 has better corrosion resistance, which can avoid damage during the cleaning. In this embodiment, the material of the third isolation layer 109 is the same as the material of the second isolation layer 108, which can increase adhesion between the third isolation layer 109 and the second isolation layer 108. In this embodiment, the material of the third isolation layer 109 is silicon nitride. In other embodiments, the material of the third isolation layer may also be silicon oxynitride.

The step of forming the third isolation layer 109 will be specifically described below.

Referring to FIG. 12, an initial third isolation layer 109a is formed, the initial third isolation layer 109a being located on the surface of the second isolation layer 108 and the substrate 100, and also filling the grooves. The initial third isolation layer 109a is also located on the top surface of the insulating cap layer 106.

In this embodiment, the initial third isolation layer 109a is formed by atomic layer deposition process. The atomic layer deposition process can deposit a material on the semiconductor structure layer by layer in the form of a monoatomic film. Therefore, the grooves can be filled more lightly by using the atomic layer deposition process. In other embodiments, the initial third isolation layer may also be formed by chemical vapor deposition.

Referring to FIG. 13, the initial third isolation layer 109a (refer to FIG. 12) on the substrate 100 is removed, the remaining of the initial third isolation layer 109a serving as the third isolation layer 109. In this embodiment, the initial third isolation layer 109a on the top surface of the insulating cap layer 106 is also removed.

In this embodiment, part of the initial third isolation layer 109a is removed by dry etching.

Continuing to refer to FIG. 13, the substrate 100 between adjacent parts of the second isolation layers 108 is etched to form trenches 110, the trenches 110 being located between adjacent bit line structures 103.

The trenches 110 can increase the area of the exposed surface of the active area 101. As such, the capacitor contact layer formed later has a relatively large contact area with the active area 101, which can reduce contact resistance.

In this embodiment, the formation of the trenches 110 and the removal of part of the initial third isolation layer 109a (refer to FIG. 12) are performed in the same etching process.

During the etching, the initial third isolation layer 109a covers the first isolation layer 107, and the first isolation layer 107 is not exposed, so the first isolation layer 107 will not be damaged in the subsequent cleaning process.

Figure 14:
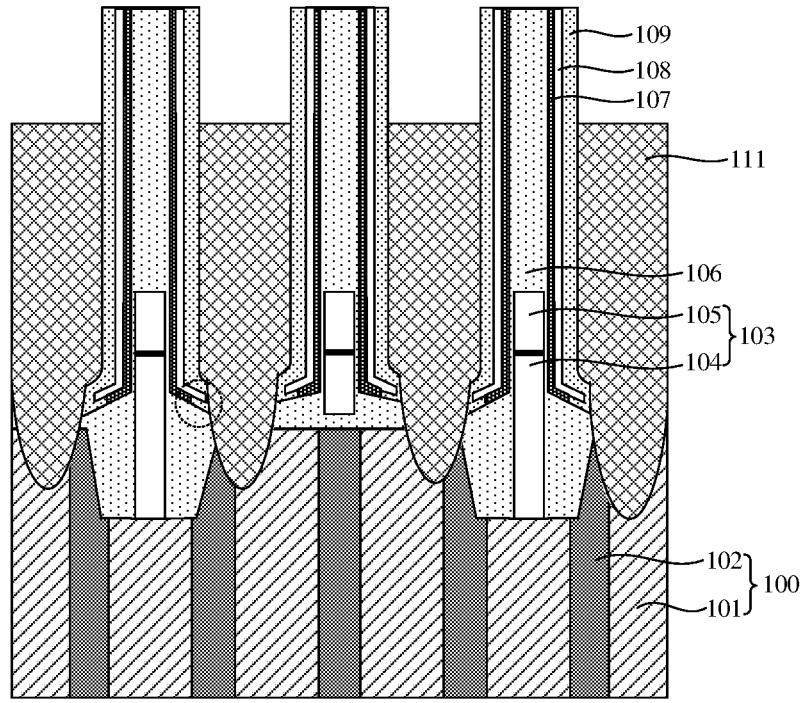
FIG. 14 is a schematic diagram of a semiconductor structure corresponding to a step of forming a capacitor contact layer according to an embodiment of the present disclosure.

Referring to FIG. 14, a capacitor contact layer 111 is formed, the capacitor contact layer 111 filling the trenches 110 (refer to FIG. 13) and being located between adjacent bit line structures 103.

The material of the capacitor contact layer 111 is a conductive material and has a relatively low resistance, for example, it may be polysilicon.

In this embodiment, the capacitor contact layer 111 is formed by chemical vapor deposition. The chemical vapor deposition process has a relatively fast deposition speed and can shorten the process time.

Before the capacitor contact layer 111 is formed, the method further includes a step of performing wet cleaning on the surface of the trenches 110 to remove impurities on the surface of the trenches 110. Since the first isolation layer 107 is not exposed, the first isolation layer 107 will not directly contact the cleaning agent, nor will be corroded by the cleaning agent. As such, the material of the capacitor contact layer 111 cannot be electrically connected to the bit line structure 103 from the damage position of the first isolation layer 107, which can avoid problems such as current leakage or short circuit and then improve the yield of the semiconductor structure.

In summary, in this embodiment, grooves of the first isolation layer 107 relative to the second isolation layer 108 is formed, and the third isolation layer 109 is filled in the grooves; the third isolation layer 109 can cover the exposed surface of the first isolation layer 107, the third isolation layer 109 can protect the first isolation layer 107 in the subsequent etching and cleaning processes, and the first isolation layer 107 will not be damaged; as such, the material of the capacitor contact layer cannot be electrically connected to the bit line structure 103 through the damage position of the first isolation layer 107, thereby avoiding the problems of current leakage or short circuit and improving the performance of the semiconductor structure.

Another embodiment of the present disclosure provides a semiconductor structure. FIG. 14 is a schematic diagram of the semiconductor structure provided in this embodiment. Referring to FIG. 14, the semiconductor structure includes: a substrate 100 and a bit line structure 103 on the substrate 100; a first isolation layer 107, the first isolation layer 107 being located on side walls of the bit line structure 103 and the substrate 100; a second isolation layer 108, the second isolation layer 108 covering the first isolation layer 107 located on the side walls of the bit line structure 103, and the second isolation layer 108 also being located on the substrate 100, wherein compared to the second isolation layer 108 on the substrate 100, the first isolation layer 107 on the substrate is recessed toward the side walls of the bit line structure 103, and grooves are formed at the recession; a third isolation layer 109 located in the grooves, the third isolation layer 109 covering the surface of the first isolation layer 107 exposed by the grooves, and the material of the first isolation layer 107 being different from the material of the third isolation layer 109, wherein trenches are formed in the substrate 100 between adjacent parts of the second isolation layers 108, and the trenches are located between adjacent bit line structures 103; and a capacitor contact layer 111 is located in the trenches, wherein the capacitor contact layer 111 fills the trenches and is located between the adjacent bit line structures 103.

A detailed description will be given below in conjunction with the drawings.

Referring to FIG. 14, the substrate 100 includes a plurality of discrete active areas 101, and an isolation structure 102 for isolating adjacent active areas 101.

The bit line structure 103 includes: a bit line contact layer 104 and a bit line conductive layer 105 that are stacked. An insulating cap layer 106 is further formed on the bit line conductive layer 105, and the insulating cap layer 106 is also located on side walls of the bit line contact layer 104 and the bit line conductive layer 105 and the surface of the substrate 100.

Specific descriptions of the substrate 100 and the bit line structure 103 refer to the previous embodiment, and details are not described herein again.

The first isolation layer 107 has a relatively low dielectric constant, which can reduce parasitic capacitance between the adjacent bit line structures 103, thereby increasing the operating speed of the semiconductor structure. In this embodiment, the material of the first isolation layer 107 is silicon oxide. In other embodiments, the material of the first isolation layer may be silicon oxycarbide.

The second isolation layer 108 has greater hardness and density, which can improve the isolation effect, to avoid problems such as a short circuit or current leakage between the bit line structure 103 and the capacitor contact layer. In addition, the second isolation layer 108 has better corrosion resistance, which can avoid damage during the cleaning. In this embodiment, the material of the second isolation layer 108 is silicon nitride. In other embodiments, the material of the second isolation layer may also be silicon oxynitride or silicon carbonitride.

The third isolation layer 109 is configured to protect the first isolation layer 107 on the side walls of the grooves. As such, in the cleaning process, the first isolation layer 107 will not be damaged by the cleaning agent, and the capacitor contact layer 111 will not undergo short circuiting or current leakage with the bit line structure 103 from the damage position of the first isolation layer 107, thereby improving the yield of the semiconductor structure.

In this embodiment, the third isolation layer 109 is also located on side walls of the second isolation layer 108. As such, the protective effect of the third isolation layer 109 on the first isolation layer 107 and the bit line structure 103 is further improved.

In this embodiment, the material of the second isolation layer 108 is the same as the material of the third isolation layer 109. As such, the adhesion between the third isolation layer 109 and the second isolation layer 108 can be increased. In this embodiment, the material of the third isolation layer 109 is silicon nitride. In other embodiments, the material of the third isolation layer may also be silicon oxynitride or silicon carbonitride.

In summary, in this embodiment, the third isolation layer 109 covers the first isolation layer 107 at the recession, which can avoid damage to the first isolation layer 107 during cleaning and then avoid a short circuit or current leakage between the capacitor contact layer 111 and the bit line structure 103 through the damage position, thereby improving the performance of the semiconductor structure.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only configured to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely configured to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the semiconductor structure and the method for manufacturing the same provided by the embodiments of the present disclosure, the third isolation layer can protect the first isolation layer from being exposed during the process of forming the trenches by etching, thereby avoiding damage to the first isolation layer and voids, and then avoiding current leakage or a short circuit between the material of the capacitor contact layer and the bit line structure through the voids.

The invention claimed is:

1. A method for manufacturing a semiconductor structure, the manufacturing method comprising:
    providing a substrate and bit line structures on the substrate;
    forming a first isolation layer, the first isolation layer being located on side walls of the bit line structures and on the substrate;
    forming a second isolation layer, the second isolation layer covering the first isolation layer located on the side walls of the bit line structures, and exposing the first isolation layer located on the substrate;
    removing the first isolation layer exposed by the second isolation layer and part of the first isolation layer below the second isolation layer, so that remaining of the first isolation layer is recessed compared to the second isolation layer toward the side walls of the bit line structures to form grooves;
    forming a third isolation layer filling the grooves, the third isolation layer covering a surface of the first isolation layer exposed by the grooves, and a material of the third isolation layer being different from a material of the first isolation layer;
    etching the substrate between adjacent parts of the second isolation layers to form trenches, the trenches being located between adjacent bit line structures; and
    forming a capacitor contact layer, the capacitor contact layer filling the trenches and being located between the adjacent bit line structures.

2. The method for manufacturing the semiconductor structure according to claim 1, wherein the first isolation layer exposed by the second isolation layer and part of the first isolation layer below the second isolation layer are removed by dry etching process; wherein an etching selection ratio of the first isolation layer to the second isolation layer in the dry etching process is 5:1 to 10:1.

3. The method for manufacturing the semiconductor structure according to claim 2, wherein etching gas used in the dry etching process comprises nitrogen trifluoride, hydrogen and nitrogen; a flow ratio of the nitrogen trifluoride, the hydrogen and the nitrogen is (5-10):(200-500):(2000-5000).

4. The method for manufacturing the semiconductor structure according to claim 2, wherein process parameters of the dry etching process comprise: radio frequency power of 300 W to 1500 W, etching time of 10 s to 60 s, and etching temperature of 30° C. to 50° C.

5. The method for manufacturing the semiconductor structure according to claim 2, wherein after the grooves are formed, in a direction parallel to a surface of the substrate, a distance from a surface of the first isolation layer exposed by the groove to the side walls of the bit line structures is a first distance, a distance from a side of the second isolation layer away from the bit line structure to the side walls of the bit line structures is a second distance, and a difference between the first distance and the second distance is 3 nm to 10 nm.

6. The method for manufacturing the semiconductor structure according to claim 2, wherein in a direction perpendicular to a surface of the substrate, a thickness ratio of the first isolation layer to the second isolation layer on the substrate is 0.3 to 4.

7. The method for manufacturing the semiconductor structure according to claim 1, wherein the step of forming the second isolation layer comprises:

forming an initial second isolation layer, the initial second isolation layer covering a surface of the first isolation layer; and removing part of the initial second isolation layer on the substrate to expose the first isolation layer on the substrate, remaining of the initial second isolation layer serving as the second isolation layer.

8. The method for manufacturing the semiconductor structure according to claim 1, wherein the third isolation layer is also located on side walls of the second isolation layer, and the step of forming the third isolation layer comprises:

forming an initial third isolation layer, the initial third isolation layer being located on a surface of the second isolation layer and the substrate, and also filling the grooves; and removing the initial third isolation layer on the substrate, remaining of the initial third isolation layer serving as the third isolation layer.

9. The method for manufacturing the semiconductor structure according to claim 8, wherein the initial third isolation layer is formed by atomic layer deposition process.

10. The method for manufacturing the semiconductor structure according to claim 1, before forming the capacitor contact layer, the manufacturing method further comprises: performing wet cleaning on a surface of the trenches to remove impurities on the surface of the trenches.

* * * * *